(12) United States Patent
Springer

(10) Patent No.: US 7,985,960 B2
(45) Date of Patent: Jul. 26, 2011

(54) VOLTAGE EXCITED PIEZOELECTRIC RESISTANCE MEMORY CELL SYSTEM

(75) Inventor: Gilbert Springer, Fremont, CA (US)

(73) Assignee: 4D-S Pty Ltd., Perth, WA (AU)

( * ) Notice: Subject to any disclaimer, the term of this patent is extended or adjusted under 35 U.S.C. 154(b) by 169 days.

(21) Appl. No.: 12/445,884

(22) PCT Filed: Feb. 16, 2009

(86) PCT No.: PCT/US2009/034222
§ 371 (c)(1),
(2), (4) Date: Apr. 16, 2009

(87) PCT Pub. No.: WO2009/103054
PCT Pub. Date: Aug. 20, 2009

(65) Prior Publication Data
US 2010/0276655 A1    Nov. 4, 2010

Related U.S. Application Data

(60) Provisional application No. 61/028,812, filed on Feb. 14, 2008.

(51) Int. Cl.
*H01L 47/00* (2006.01)
(52) U.S. Cl. .......... 257/2; 257/5; 257/295; 257/E45.002
(58) Field of Classification Search .................. 257/2, 5, 257/295, E45.002
See application file for complete search history.

(56) References Cited

U.S. PATENT DOCUMENTS

| | | | |
|---|---|---|---|
| 5,596,522 A * | 1/1997 | Ovshinsky et al. | 365/113 |
| 6,791,859 B2 | 9/2004 | Hush et al. | |
| 2005/0128840 A1 | 6/2005 | Rinerson | |
| 2007/0069263 A1 * | 3/2007 | Mizuuchi et al. | 257/295 |
| 2007/0153564 A1 | 7/2007 | Mori et al. | |

* cited by examiner

*Primary Examiner* — Tu-Tu V Ho
(74) *Attorney, Agent, or Firm* — Sawyer Law Group, P.C.

(57) ABSTRACT

The present invention discloses a memory system comprising a plurality of crystals, and at least two conductors. The at least two conductors being orthogonal to each other. Wherein at least one of the plurality of crystals are bounded by the orthogonal intersection of the at least two conductors.

14 Claims, 4 Drawing Sheets

VOLTAGE EXCITED PIEZOELECTRIC RESISTANCE MEMORY CELL SYSTEM

CROSS-REFERENCE TO RELATED APPLICATIONS

This application claims the benefit of priority of U.S. Patent Application No. 61/028,812, entitled "VOLTAGE EXCITED PIEZOELECTRIC RESISTANCE," filed on Feb. 14, 2008, and PCT Application No. PCT/US09/34222, entitled "VOLTAGE EXCITED PIEZOELECTRIC RESISTANCE MEMORY CELL SYSTEM," filed on Feb. 16, 2009, all of which are incorporated herein by reference.

FIELD OF THE INVENTION

The present invention relates generally to memory cells and more particularly to crystalline cells utilized therefor.

BACKGROUND OF THE INVENTION

As Moore's Law has been predicting, the capacity of memory cells on silicon for the past 15-20 years has effectively doubled each year. Moore's Law is that every year the amount of structures or gates on a silicon wafer will double, but the price will essentially stay the same. And in some cases, the price will even erode. As these memory cells continue to shrink, the technology is starting to reach a barrier know as the quantum limit, that is, they are actually approaching molecular boundaries, so the cells can not get any smaller.

Disk drives have been the dominant prime storage in terms of peak capacity, because storing individual domains (magnetic transition sites) on the disk drives unlike semiconductor memory cells disk memory sites do not require connections to get in and out of those domains. Now, in recently history, semiconductor resolutions apply feature geometries with 90 nanometer feature resolutions progressing to 45 and 25 nanometer feature size sizes, with these feature capabilities, the memory cell size and chip capacity equation changes, furthermore, certain semiconductor memory technologies have applied a principal of geometric redundancy, where a multiple of data bits may be stored in a single cell. This property of a memory cell to support a multiple of values is sometimes referred to as its dynamic range. To date the for memory cells have abilities to support a dynamic range anywhere between 1 and 4 bits, gives you multiples of storage per memory cell. These combined properties of semiconductors, have increased capacities and diminished costs to now directly compete with disk drives.

Another issue associated with semiconductor memory manufacturing has been the substantial costs of the semiconductor foundries which can run up to more than a billion dollars to establish with amortizing expenses inflating the unit cost of memory chips. In recent history this represented price barriers compared with cost per capacity of a disk drive file. Now, with advances in foundry resolutions enabling smaller cell sizes and the geometric redundancy of multiple bit-level per memory cell semiconductor memory is actually competitive per unit cost, and substantially more rugged in terms of high G forces than memory files on a disk drive.

In Flash memories, there has been improvements in the Moore's Law effect but that has become a diminishing proposition because as the cells started getting smaller and smaller, write cycle limitations and ability to support dynamic ranges are diminished.

So basically, as characterized in recent press reviews, Flash memory is hit the proverbial wall in increasing data capacity per unit cost, as the quantum limit is approached.

But another issue with Flash memory is it is limitations in write speeds. In order to compete with disk drive performance, the memory cells word structure is configured to switch in parallel. Another issue is the number of write cycle limitations the cell will tolerate before it burns out. Prior to the substantial reduction in cell size, it was approximately in the range of one million, however, as the foundry feature size resolutions reduced in size, rewrite cycle diminished to approximately 100,000 write cycles. For most non-prime storage applications that may be practical. However, for SRAM and DRAM applications where you're actually exchanging data at substantial repetition rates, several times per microsecond.

Accordingly, what is desired is a memory system and method which overcomes the above-identified problems. The system and method should be easily implemented, cost effective and adaptable to existing storage applications. The present invention addresses such a need.

SUMMARY OF THE INVENTION

The present invention discloses a memory system comprising a plurality of crystals, and at least two conductors, at least two conductors being orthogonal to each other. Wherein at least one of the plurality of crystals are bounded by the orthogonal intersection of the at least two conductors.

DESCRIPTION OF PREFERRED EMBODIMENTS

The present invention relates generally to memory cells and more particularly to crystalline cells utilized therefor. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Basic Principle

Figure 1:
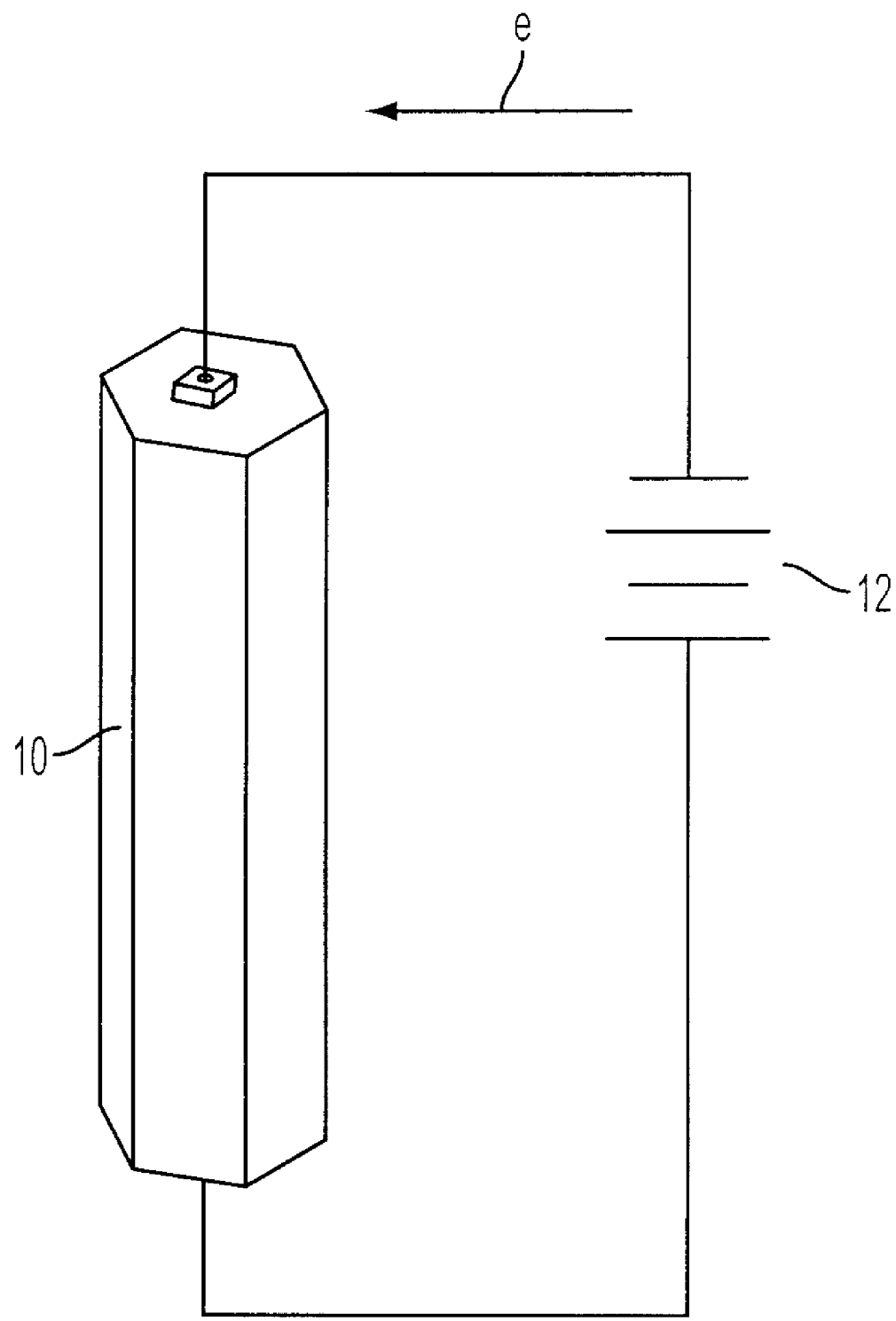
FIG. 1 illustrates power source exciting the crystal causing electron drift along the axis of the crystal.

Observations of crystalline structure of Praseodymium Calcium Manganese Oxide $Pr_xCa^yMnO$ and/or $Re_x Ca_y MnO$ (PCMO), where Re's are rare-earths, physical and conductive behavior of the "isolated crystal" formed by a proprietary plasma deposition system show behavior characterized by the following observations:

A crystal shows properties and exhibits behavior similar to that of an individual wire conductor. FIG. 1 illustrates the power source 12 exciting a crystal 10 associated with a plurality of crystals to make a memory cell. The power source causes electron drift along the axis of the crystal 10. In this embodiment only one crystal is shown for illustrative purposes but one of ordinary skill in the art recognizes a plurality of crystals.

Figure 2:
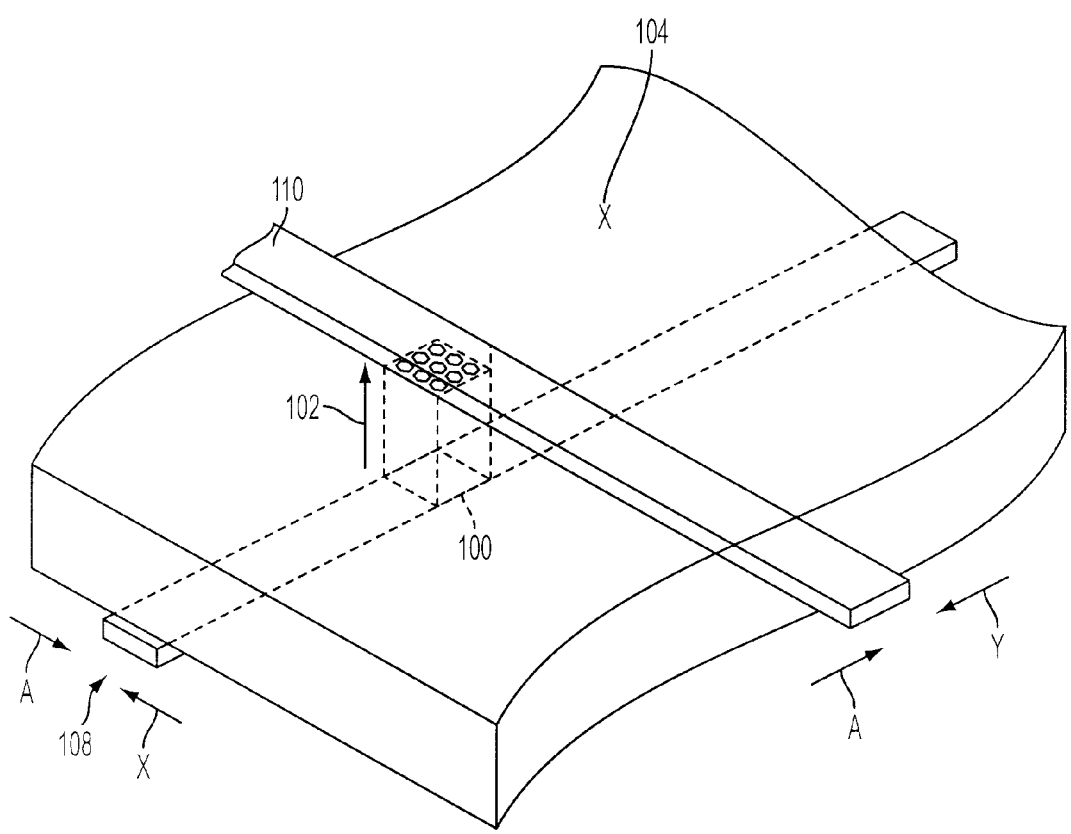
FIG. 2 shows that a memory cell can be established by the congruency of a z axis segment of a deposited crystalline memory plane formed by a superimposed bottom x-conductor of width-A and at the top an orthogonal y-conductor of width-A.

FIG. 2 shows that a memory cell 100 can be established by the congruency of a z axis segment 102 of a deposited crystalline memory plane 104 formed by a superimposed bottom x-conductor 108 of width-A and at the top an orthogonal y-conductor 110 of width-A.

Figure 3A:
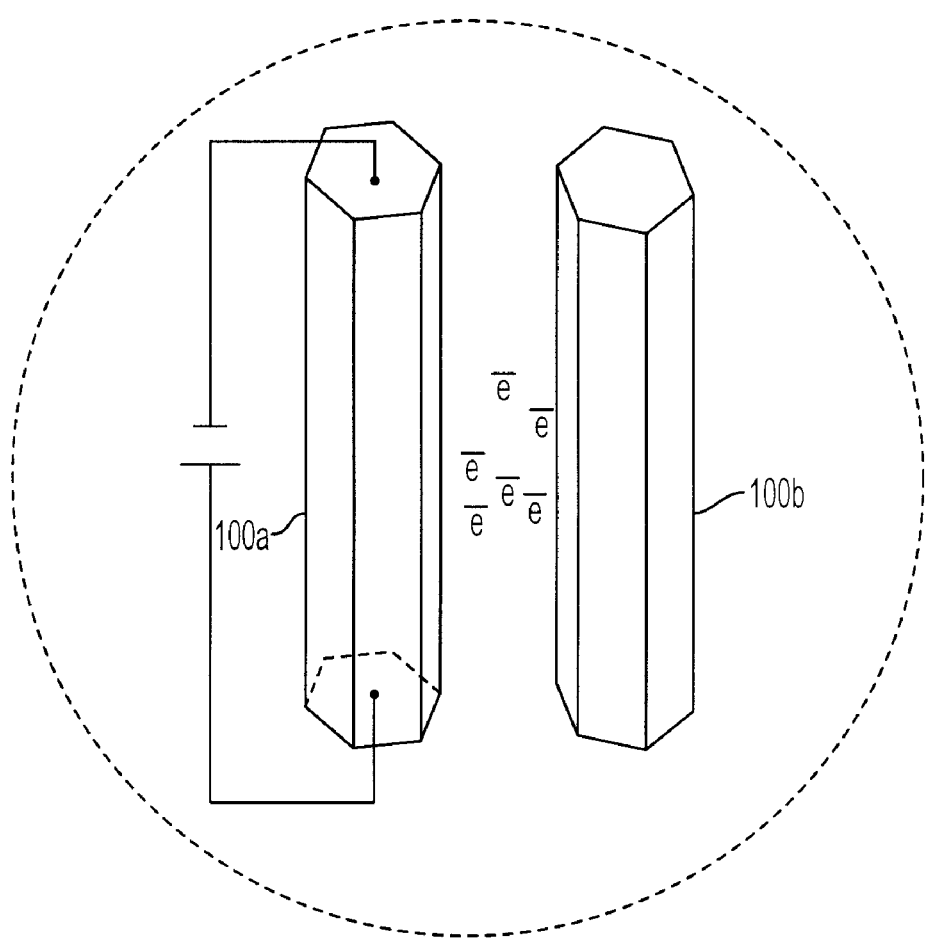
FIGS. 3A and 3B show no significant propensity for oblique, orthogonal or substantial angular deviation of the electron drift from the axis of the excited cell (grouping of contiguous excited crystals) to adjacent cells.
Figure 3B:
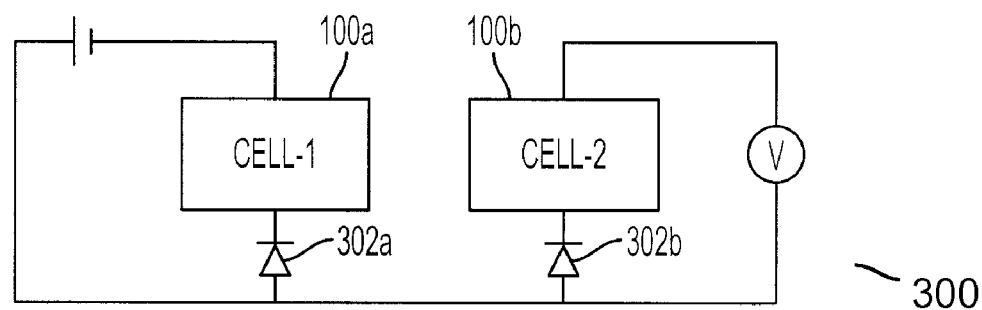

Cell 100a to cell 100b behavior of FIG. 3A shows no significant propensity for oblique, orthogonal or substantial angular deviation of the electron drift from the axis of the excited cell (grouping of contiguous excited crystals) to adjacent cells, because there is no material between the crystals that support election conduction since it is comprised of a non-amorphous chalcogenite material. Both cells 100a and 100b are defined by memory-plane separated by two sets of intersecting X/Y conductors, if such exchange of electrons occur from one crystal to its adjacent crystal the process of electron exchange is (known as the percolation effect). Test configuration 300 of FIG. 3B illustrates what is accomplished in one instance by diode barriers 302a and 302b between the cell which is excited and its adjacent cell 100b.

The resistance of the excited cell 100a is altered by the application of an applied voltage to the (Z) axis of the cell.

Figure 4:
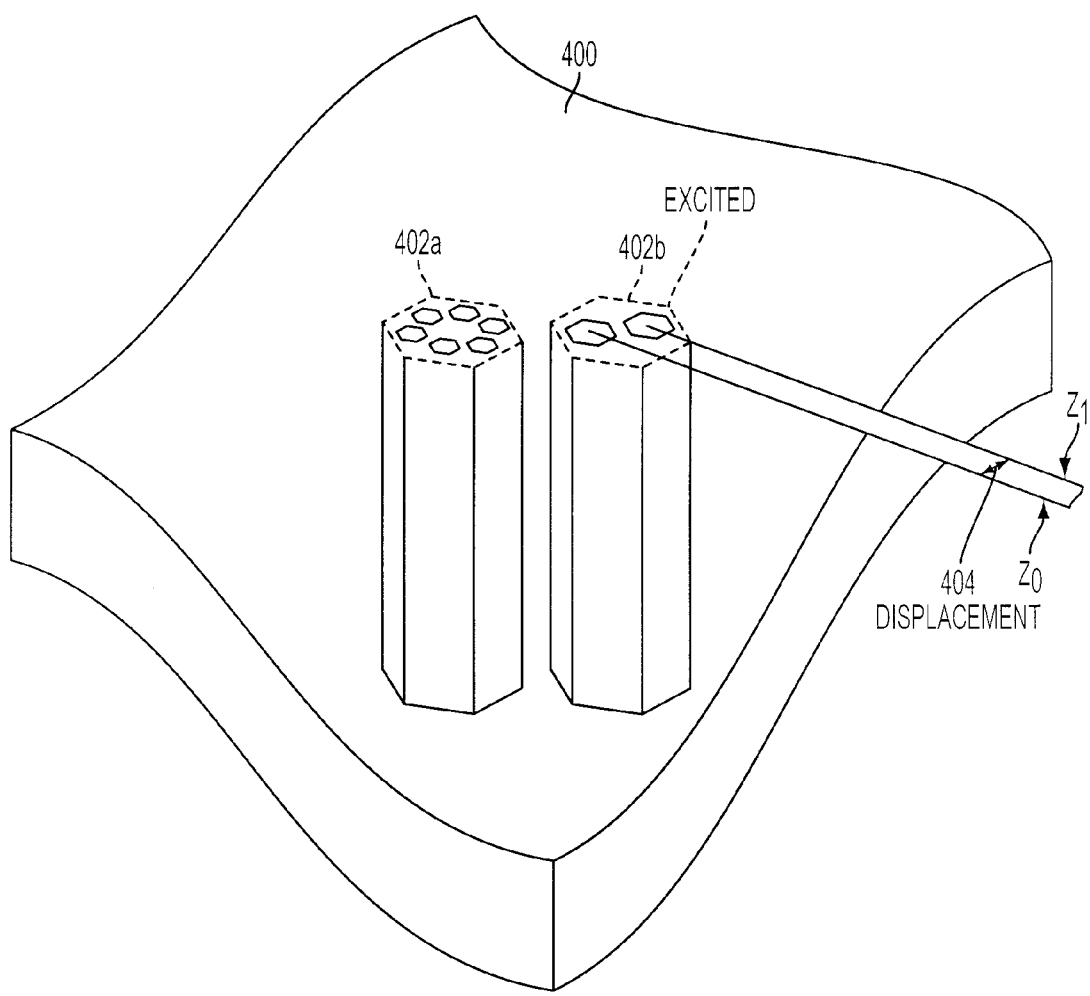
FIG. 4 shows a memory plane and cell regions of normal position and a cell of excited crystals under elongation (strain) showing an effective cell displacement and or stress from a voltage exciting of the piezoelectric properties of the material.

FIG. 4 shows a memory plane 400 and cell regions 402a of normal position and a cell of regions 402b of excited crystals. The cells in region 402b under elongation (strain) showing an effective cell displacement 404 from piezoelectric properties of the material. The strain distorts the crystals effectively minimizing the path of electron drift in the crystal. Ohmic values increase as a function of crystal distortion determinable by the application of various values of applied voltage and pulse width.

Resultant "programmed" cell resistance based on the strain can assume values as a function of either applied voltage or pulse-widths at appropriate voltage appropriate magnitudes or a combination of both voltage and pulse modulation.

Cell resistance values based on the strain may be programmed by appropriate voltage and or appropriate pulse width to a range of desired states of assignable bit levels per cell representing binary values assignable to a byte value.

The resistive "state" of the cell based on the strain may be interrogated by a lesser voltage (dc or pulsed) without changing the resistive state of the "isolated cell".

The cell's resistance can be reset to its original "rest" state by a reverse polarity voltage of sufficient magnitude; and the cell resistance can be reverse modulated by reverse voltages and or pulses of "appropriate" magnitudes.

Mechanism of Programmable Resistance

A typical PCMO or chalcogenite crystalline cell includes piezoelectric properties, when excited with axial voltages of appropriate magnitudes a stress/strain and/or elongation of the cell occurs. The cell is a bounded area formed by at least two conductors (X[a] ... ) (Y[a] ... ) with an array of crystals orthogonal to the surface of the conductor. The excited cell's crystalline physical change of state introduced by the applied voltage can be observed by reduced conduction efficiency introduced by interference of electron motion through the crystal in its stressed state. In this altered stress state, the electron drift rate of the normal "rest-state" is restricted demonstrating a change in the cells resistance. The range of influence of the cells crystal state is a function of the change in the cell's overall geometry. The introduced stress on the cell is retained until it is again excited by a voltage of appropriate magnitude. An appropriate voltage of reverse polarity will return the crystal to its rest state. In so doing a memory cell can be utilized that includes a plurality of these crystals that can switch more efficiently, can be smaller in size and ultimately be less costly than existing technologies.

Although the present invention has been described in accordance with the embodiments shown, one of ordinary skill in the art will readily recognize that there could be variations to the embodiments and those variations would be within the spirit and scope of the present invention. Although PCMO crystals are a type of crystal that operates effectively and efficiently in accordance with an embodiment, one of ordinary skill in the art readily recognizes that crystals can be made of a variety of materials to form another specie of chalcogenite. Accordingly, many modifications may be made by one of ordinary skill in the art without departing from the spirit and scope of the appended claims.

What is claimed is:

1. A memory cell comprising:
a plurality of crystals wherein the plurality of crystals comprise one of Praseodymium Calcium Manganese Oxide (PCMO) and or a chalcogenite material with similar $Re_x Ca_y MnO$ crystals; and
at least two conductors, the at least two conductors being orthogonal to each other; wherein at least one of plurality of crystals are bounded by the orthogonal intersection of the at least two conductors.

2. The cell of claim 1, wherein the crystals are supported by amorphous chalcogenite.

3. A memory system comprising:
a plurality of memory cell regions; wherein each cell region comprises a plurality of crystals, wherein the crystals are supported by amorphous chalcogenite; and at least two conductors, the at least two conductors being orthogonal to each other; wherein at least one of plurality of crystals are bounded by the orthogonal intersection of the at least two conductors; and a power source for exciting the crystals of one of memory cell regions, wherein resistive values increase as a function of the distortion of the excited crystals.

4. The memory system of claim 3, wherein the plurality of crystals comprise one of Praseodymium Calcium Manganese Oxide (PCMO) and or chalcogenite materials of $Re_x Ca_y MnO$ crystals.

5. The memory system of claim 3 wherein the resultant programmed cell resistance based on the excited assumes values as a function of applied voltage.

6. The memory system of claim 3 wherein cell resistance values may be programmed by the appropriate voltage.

7. The memory system of claim 3 wherein a resistive state of the excited cell is interrogated by a lesser value without changing the resistive state.

8. The memory system of claim 3 wherein the excited cells resistance can be reset to its original rest state by a reverse voltage of sufficient magnitude.

9. A memory cell comprising:
a plurality of crystals, wherein the crystals are supported by amorphous chalcogenite; and
at least two conductors, the at least two conductors being orthogonal to each other; wherein at least one of plurality of crystals are bounded by the orthogonal intersection of the at least two conductors.

10. A memory system comprising:
a plurality of memory cell regions; wherein each cell region comprises a plurality of crystals, wherein the plurality of crystals comprise one of Praseodymium Calcium Manganese Oxide (PCMO) and or a chalcogenite material with similar $Re_x, Ca_y, MnO$ crystals, and at least two conductors, the at least two conductors being orthogonal to each other; wherein at least one of plurality of crystals are bounded by the orthogonal intersection of the at least two conductors; and a power source for exciting the crystals of one of memory cell regions, wherein resistive values increase as a function of the distortion of the excited crystals.

11. The memory system of claim 10 wherein the resultant programmed cell resistance based on the excited assumes values as a function of applied voltage.

12. The memory system of claim 10 wherein cell resistance values may be programmed by the appropriate voltage.

13. The memory system of claim 10 wherein a resistive state of the excited cell is interrogated by a lesser value without changing the resistive state.

14. The memory system of claim 10 wherein the excited cells resistance can be reset to its original rest state by a reverse voltage of sufficient magnitude.

* * * * *